(12) United States Patent
Khanna

(10) Patent No.: US 7,113,415 B1
(45) Date of Patent: Sep. 26, 2006

(54) MATCH LINE PRE-CHARGING IN A CONTENT ADDRESSABLE MEMORY HAVING CONFIGURABLE ROWS

(75) Inventor: Sandeep Khanna, Los Altos, CA (US)

(73) Assignee: NetLogic Microsystems, Inc., Mountain View, CA (US)

(*) Notice: Subject to any disclaimer, the term of this patent is extended or adjusted under 35 U.S.C. 154(b) by 138 days.

(21) Appl. No.: 10/859,477

(22) Filed: Jun. 1, 2004

(51) Int. Cl.
*G11C 15/00* (2006.01)

(52) U.S. Cl. ............ 365/49; 365/203; 365/230.03
(58) Field of Classification Search .......... 365/49 O, 365/203, 230.03
See application file for complete search history.

(56) References Cited

U.S. PATENT DOCUMENTS 6,191,970 B1* 2/2001 Pereira .................. 365/49
6,243,280 B1* 6/2001 Wong et al. ............ 365/49
6,243,281 B1* 6/2001 Pereira .................. 365/49
6,477,071 B1* 11/2002 Edman et al. ........... 365/49
6,768,659 B1* 7/2004 Gillingham et al. ...... 365/49

FOREIGN PATENT DOCUMENTS

WO   WO 03/050819 A1 * 6/2003

* cited by examiner

Primary Examiner—VanThu Nguyen
(74) Attorney, Agent, or Firm—William L. Paradice, III

(57) ABSTRACT

A content addressable memory (CAM) device includes a CAM array and a configuration circuit. The CAM array has a plurality of rows of CAM cells, each row segmented into a plurality of row segments, each row segment including a plurality of CAM cells coupled to a corresponding match line segment, and a match line control circuit having an input coupled to the corresponding match line segment, an output coupled to the match line segment in a next row segment, and a control terminal to receive a corresponding enable signal. The configuration circuit has an input to receive configuration information indicative of a width and depth configuration of the CAM array and having outputs to generate the enable signals.

25 Claims, 14 Drawing Sheets

| CONFIG | CONFIG SIGNAL | ADDR | RA | SA | SDA |
|---|---|---|---|---|---|
| 4k x 72 | SZ1 | A11-A0 | A11-A2 | A1-A0 | A1-A0 |
| 2k x 144 | SZG1 | A10-A0 | A10-A1 | A0 | A0, SSEL0 |
| 1k x 288 | SZGZ | A9-A0 | A9-A0 | — | SSEL1-SSEL0 |

FIG. 4

| CONFIG | A1 | A0 | SSEL1 | SSEL0 | SEN4 | SEN3 | SEN2 | SEN1 |
|---|---|---|---|---|---|---|---|---|
| 4k x 72 | 0 | 0 | X | X | 0 | 0 | 0 | 1 |
| 4k x 72 | 0 | 1 | X | X | 0 | 0 | 1 | 0 |
| 4k x 72 | 1 | 0 | X | X | 0 | 1 | 0 | 0 |
| 4k x 72 | 1 | 1 | X | X | 1 | 0 | 0 | 0 |
| 2k x 144 | X | 0 | X | 0 | 0 | 0 | 0 | 1 |
| 2k x 144 | X | 0 | X | 1 | 0 | 0 | 1 | 0 |
| 2k x 144 | X | 1 | X | 0 | 0 | 1 | 0 | 0 |
| 2k x 144 | X | 1 | X | 1 | 1 | 0 | 0 | 0 |
| 1k x 188 | X | X | 0 | 0 | 0 | 0 | 0 | 1 |
| 1k x 188 | X | X | 0 | 1 | 0 | 0 | 1 | 0 |
| 1k x 188 | X | X | 1 | 0 | 0 | 1 | 0 | 0 |
| 1k x 188 | X | X | 1 | 1 | 1 | 0 | 0 | 0 |

FIG. 5

| CONFIG | CSSEL1 | CSSEL0 | CEN1 | CEN2 | CEN3 | CEN4 |
|---|---|---|---|---|---|---|
| 4K x 72 | X | X | 1 | 1 | 1 | 1 |
| 2k x 144 | X | 0 | 1 | 0 | 1 | 0 |
| 2k x 144 | X | 1 | 0 | 1 | 0 | 1 |
| 1k x 288 | 0 | 0 | 1 | 0 | 0 | 0 |
| 1k x 288 | 0 | 1 | 0 | 1 | 0 | 0 |
| 1k x 288 | 1 | 0 | 0 | 0 | 1 | 0 |
| 1k x 288 | 1 | 1 | 0 | 0 | 0 | 1 |

FIG. 8

MATCH LINE PRE-CHARGING IN A CONTENT ADDRESSABLE MEMORY HAVING CONFIGURABLE ROWS

FIELD OF INVENTION

This invention relates generally to semiconductor memories and specifically to content addressable memories.

DESCRIPTION OF RELATED ART

Content addressable memories (CAMs) are frequently used for address look-up functions in Internet data routing. For example, routers used by local Internet Service Providers (ISPs) typically include one or more CAMs for storing a plurality of Internet addresses and associated data such as, for instance, corresponding address routing information. When data is routed to a destination address, the destination address is compared with all CAM words, e.g., Internet addresses, that are stored in the CAM. If there is a match, routing information corresponding to the matching CAM word is output and thereafter used to route the data.

A CAM device includes a CAM array having a plurality of memory cells arranged in an array of rows and columns, with each row storing a CAM word (e.g., a destination or forwarding address). During compare operations, a search key (sometimes called a comparand word) is provided to the CAM device and compared with all the CAM words stored in the array. For each CAM word that matches the search key, a corresponding match line is asserted to indicate the match result. If any of the match lines are asserted, a match flag is asserted to indicate the match condition, and a priority encoder determines the index of the highest priority matching (HPM) entry in the CAM array. The HPM index may be used to access associative data stored in an associated memory such as, for example, a RAM device.

Some CAM devices allow for accessing a segment of CAM cells in an intra-row configurable CAM device. For example, U.S. Pat. No. 6,243,281, which is assigned to the assignee of the present application and is hereby incorporated by reference, discloses a CAM array having a plurality of rows of CAM cells in which each row is segmented into a plurality of row segments. Each row segment includes a plurality of CAM cells coupled to a corresponding match line segment. Address logic coupled to the CAM array uniquely addresses individual row segments in response to first configuration information, and uniquely addresses a group of the row segments in response to second configuration information. The first configuration information is indicative of a first width and depth configuration of the CAM array, and the second configuration information is indicative of a second width and depth configuration of the CAM array.

For the CAM device disclosed in U.S. Pat. No. 6,243,281, all match line segments in each row are typically pre-charged prior to compare operations without regard to the particular width and depth configuration of the CAM array and without regard to match results in previous row segments. During compare operations between comparand data and data stored in the CAM array, if all CAM cells in a row segment match the comparand data, the CAM cells do not discharge the corresponding match line segment, which remains in its charged state to indicate a match condition for the row segment. Conversely, if any CAM cell in the row segment does not match the comparand data, the CAM cell discharges the match line segment to indicate a mismatch condition for the row segment. The discharged match line segments are then pre-charged prior to the next compare operation.

Alternately charging and discharging all the match line segments that have a mismatch condition during compare operations may result in significant power consumption. This power consumption increases as the size and/or density of the CAM array increases and, therefore, undesirably limits the memory size and the scalability of the CAM array. Thus, it would be desirable to reduce the power consumption associated with charging the match line segments of an intra-row configurable CAM array during compare operations.

BRIEF DESCRIPTION OF THE DRAWINGS

FIG. 4 is one embodiment of a truth table for the select logic of FIG. 3;

FIG. 5 is one embodiment of a truth table for the segment decoder of FIG. 3;

FIG. 8 is one embodiment of a truth table for the select logic of FIG. 7;

Like reference numerals refer to corresponding parts throughout the drawing figures.

DETAILED DESCRIPTION

A method and apparatus for reducing power consumption in a CAM device are discussed below in the context of an intra-row configurable CAM device for simplicity only. It is to be understood that embodiments of the present invention are equally applicable to other structures that may include intra-row configurability features such as, for example, RAM, EPROM, EEPROM, and flash memory devices. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Embodiments of the present invention reduce the power consumption of CAM devices having intra-row configurability features during compare operations between a comparand word and data values stored therein by selectively pre-charging match line segments in one or more selected row segments in response to match results in one or more previous row segments and in response to the particular row configuration of the CAM device.

Figure 1:
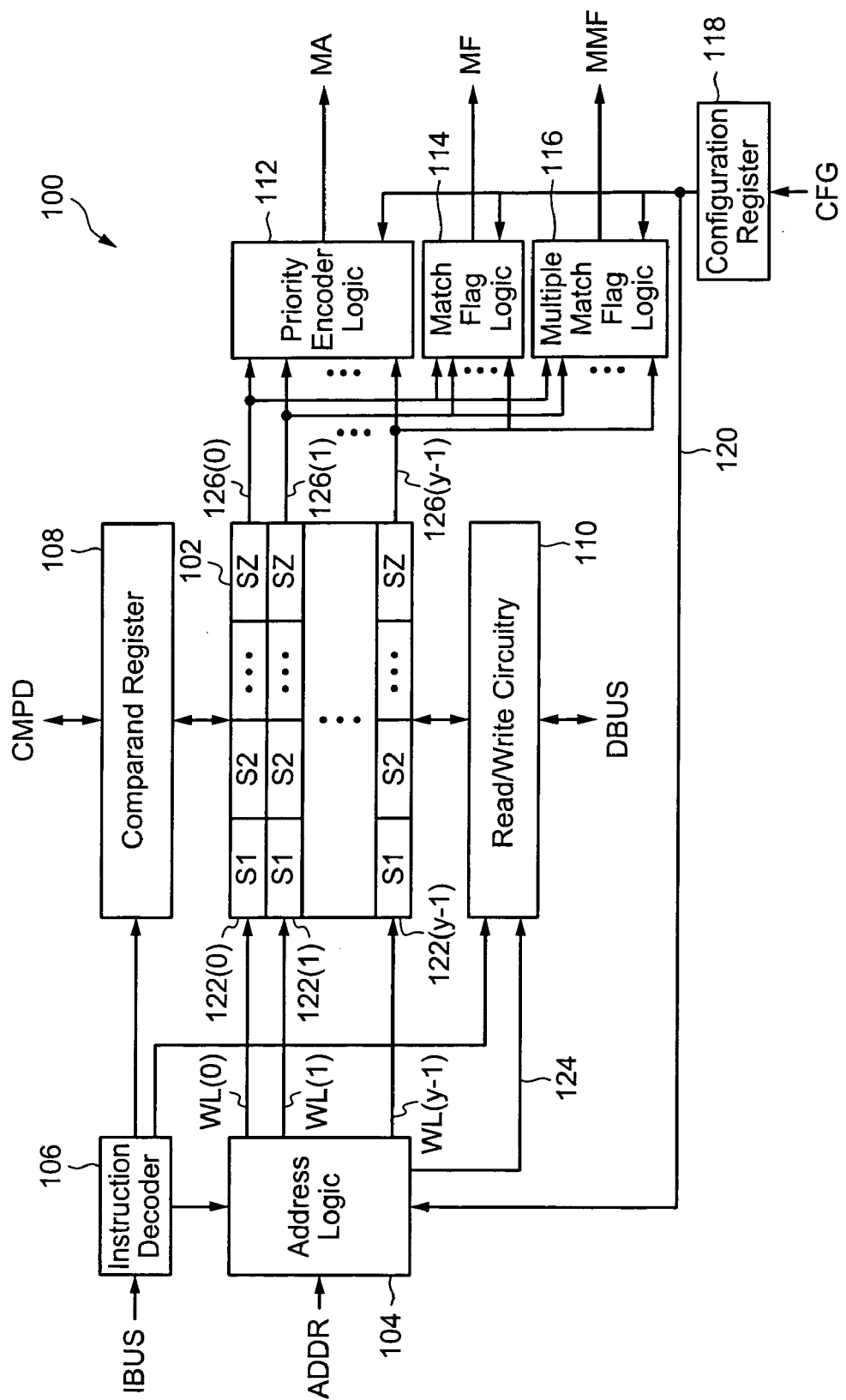
FIG. 1 is a block diagram of a CAM device generally representative of an intra-row configurable CAM device within which embodiments of the present invention can be implemented.

FIG. 1 is generally representative of an exemplary CAM device 100 within which embodiments of the present invention may be implemented. CAM device 100, which is consistent with that disclosed in U.S. Pat. No. 6,243,281, includes a CAM array 102 that includes Y rows 122(0)–122(y-1) of CAM cells each segmented into Z row segments S1–SZ of W CAM cells (CAM cells not shown in FIG. 1 for simplicity), where W, Y, and Z are any integer numbers. The CAM cells can be any type of CAM cells including binary, ternary, and quaternary CAM cells. One or more of the row segments may also include a different number of CAM cells. Other well-known signals that can be provided to CAM device 100, such as enable signals, reset signals, and clock signals, are not shown for simplicity.

CAM array 102 can be configured into n different ZY/n width by nW depth configurations, where n is an integer from 1 to Z. For one embodiment, Y=1024 (1k) rows, Z=4 segments, and W=72 cells per segment. These values for W, Y, and Z will be used throughout this application for purposes of discussion only. For one embodiment, CAM array 102 can be configured to operate in three different configurations: (1) 1k×288, (2) 2k×144, and (3) 4k×72, thereby enabling a single CAM array to store and maintain a different table size in each different configuration mode.

For other embodiments, CAM array 102 can be configured on a row-by-row or section-by-section basis to store data words of ×72, ×144 or ×288 bits that span one or more rows of the CAM array. For example, a first half of CAM array 102 can be configured as 512×288, the next quarter of CAM array 102 can be configured as 512×144, and the final quarter of CAM array can be configured as 1k×72. This flexibility allows CAM device 100 to store and maintain multiple tables of different sizes.

Configuration information CFG is used to program CAM device 100 to operate CAM array 102 in one of the multiple array configurations. The configuration information includes one or more signals that indicate the operating configuration of the CAM array 102 and the CAM device. For example, a separate configuration or control signal may be associated with each configuration of the device. The configuration information may be stored in configuration register 118 and subsequently provided over bus 120 to address logic 104, priority encoder logic 112, match flag logic 114 and/or multiple match flag logic 116. Alternatively, configuration register 118 may be omitted and the configuration information provided directly to one or more of the various circuit blocks. For another embodiment, the configuration information may be provided as part of read, write or compare instructions on the instruction bus IBUS to instruction decoder 106.

Instruction decoder 106 decodes various instructions provided on instruction bus IBUS. The instructions may include instructions to write data to one or more row segments of the CAM array, read data from one or more row segments of the CAM array, and to compare comparand data with one or more row segments of the CAM array. The comparand data may be provided on the comparand bus CBUS and stored in comparand register 108 or directly provided to CAM array 102. CAM device 100 may also include one or more global mask registers (not shown) for the comparand data provided to CAM array 102.

Instruction decoder 106 provides various control signals to the address logic 104, read/write circuitry 110, and comparand register 108 to control when CAM device 100 performs one of the operations. Additionally, instruction decoder 106 may provide one or more control signals to CAM array 102, priority encoder logic 112, match flag logic 114, multiple match flag logic 116, and configuration register 118 to enable these circuits to perform their associated functions at an appropriate time. For an alternative embodiment, instruction decoder 106 may be omitted and various read, write and compare control signals may be provided directly to one or more of the circuit blocks.

Data can be communicated with the various row segments using address logic 104 and read/write (data access) circuitry 110. Address logic 104 uniquely addresses one row segment or a group of row segments in response to the configuration information and an input address provided on address bus ADDR. Address logic 104 decodes the input address and outputs a decoded row address and a decoded segment address. The decoded row address enables one of the rows of CAM cells via word lines WL(0)–WL(y-1), and the decoded segment address is provided on bus 124 to the read/write circuitry 110 to selectively enable one or more of the row segments to communicate data with the data bus DBUS. The configuration information provided to address logic 104 determines whether the decoded segment address provided to read/write circuitry 110 enables one row segment to communicate with the data bus, or enables a group of row segments to communicate with the data bus. For example, when CAM array 102 is configured in ZY (rows)×W (cells) mode (e.g., 4k×72), each decoded segment address uniquely addresses one row segment of a selected row such that data can be written to or read from a particular row segment by asserting the corresponding word line and enabling the row segment to communicate with DBUS through read/write circuitry 110. When CAM array 102 is configured in other configurations, each decoded segment address uniquely addresses a group of row segments. Data may be simultaneously communicated with the entire group of row segments, or data may be communicated on a segment-by-segment basis within the addressed group.

Figure 2:
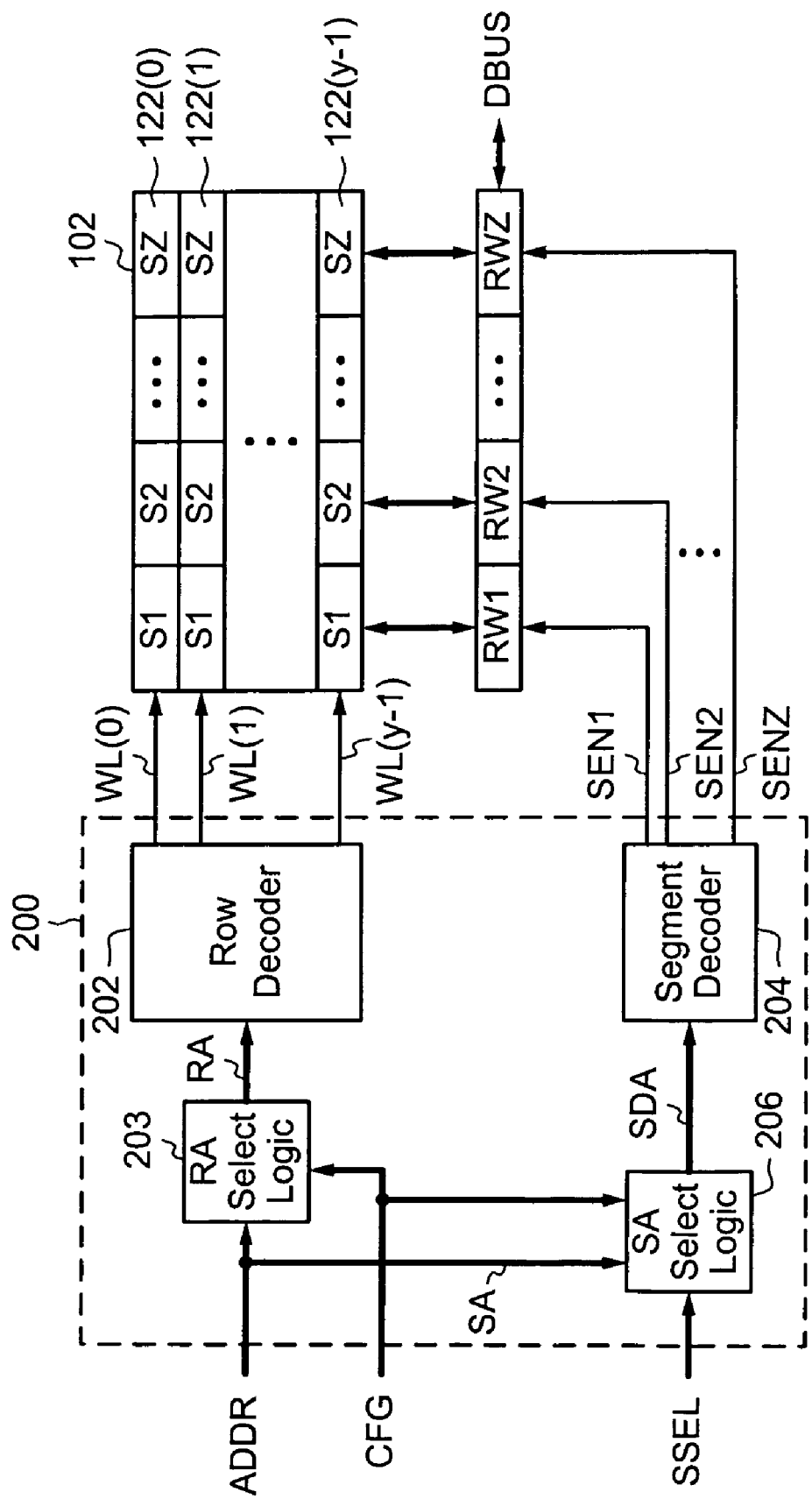
FIG. 2 is a block diagram of one embodiment of the address logic of FIG. 1.

FIG. 2 shows address logic 200 that is one embodiment of address logic 104 of FIG. 1. Address logic 200 includes row decoder 202, row address (RA) select logic 203, segment decoder 204, and segment address (SA) select logic 206. Row decoder 202 receives and decodes row address RA to select and enable one of the word lines WL(0)–WL(y-1). The word lines are each connected to all of the row segments of one of the corresponding rows 122(0)–122(y-1). When a word line is enabled, data may be written to or read from one or more CAM cells in the selected row in a conventional manner. For an alternative embodiment, each row segment may be connected to its own word line. In response to the configuration information, RA select logic 203 determines which address signals of an input address on ADDR are provided as RA to the row decoder.

Segment decoder 204 receives and decodes the segment decoder input address SDA to select and enable one of segment enable lines SEN1–SENZ. Each segment enable line selectively enables a corresponding read/write circuit RW1–RWZ to communicate data between the DBUS and a corresponding row segment S1–SZ, respectively, of the selected row of CAM cells. Each read/write circuit includes conventional read and write circuits such as sense amplifiers and data drivers.

Segment decoder 204 receives SDA from SA select logic 206. In response to the configuration information on bus 120, SA select logic 206 determines SDA from the segment address SA provided on address bus ADDR, the segment select signals SSEL, or from a combination of both. The segment address uniquely identifies the address of a row segment or a group of row segments for a selected row of CAM cells. The segment select signals may be used to uniquely address and access one of the row segments within an addressed group of row segments.

Figure 3:
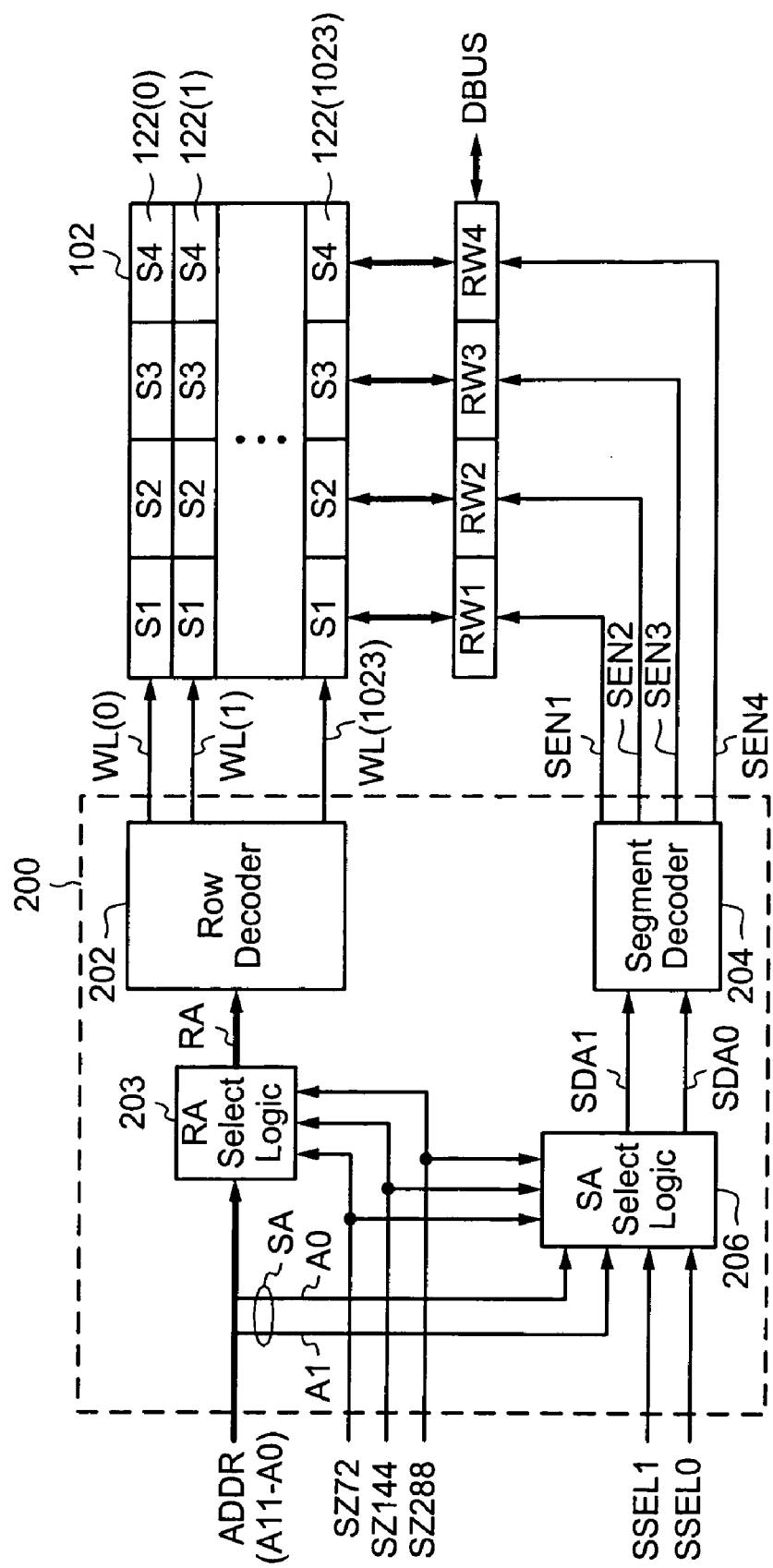
FIG. 3 is one example of the address logic of FIG. 2 for particular configurations of the CAM device.

The operation of address logic 200 is further illustrated in FIG. 3 in which CAM array has Y=1024 rows 122(0)–122(1023), Z=4 row segments S1–S4 per row, and each row segment having W=72 CAM cells. Other configurations may be used. The CAM array may be configured to operate in three different modes in response to the configuration signals SZ72, SZ144 and SZ288. When SZ72 is enabled, the CAM array operates in a 4k×72 mode; when SZ144 is enabled, the CAM array operates in a 2k×144 mode; and when SZ288 is enabled, the CAM array operates in a 1k×288 mode. A summary of the inputs address signals, RA, SA, SDA and SEN1–SEN4 used and generated for this example is shown in the truth tables of FIGS. 4 and 5.

The input address on the address bus has twelve bits A11–A0. In the 4k×72 mode, all twelve bits A11–A0 are used to uniquely address each of the 4k row segments in CAM array 102. Bits A11–A2 are selected by RA select logic 203 and are used as the row address for row decoder 202 to select one of the CAM rows; and bits A1–A0 are provided to SA select logic 206 and used to select one of the row segments for a selected row of cells. In this mode, SZ72 is enabled and SA select logic 206 provides A1 and A0 as SDA1 and SDA0, respectively, to segment decoder 204. A1 and A0 are decoded by segment decoder 204 to generate SEN1–SEN4 and select a particular row segment in a selected row of cells for communication.

In the 2k×144 mode, eleven bits A10–A0 are used to uniquely address each of the 2k groups of row segments in CAM array 102. Each group of row segments includes two row segments. The most significant bit A11 does not participate in addressing a group of row segments. Bits A10A10–A1 are selected by RA select logic 203 as the row address and are used by row decoder 202 to select one of the CAM rows; and bit A0 is provided to SA select logic 206 and used to select one of the groups of row segments for a selected row of cells. In this mode, SZ144 is enabled and SA select logic 206 provides A0 as SDA1 to segment decoder 204, and provides SSEL0 as SDA0 to segment decoder 204. A0 and SSEL0 are decoded by segment decoder 204 to generate SEN1–SEN4 and select for communication a particular group of row segments in a selected row of cells in response to A0, and to select for communication a particular row segment in the selected group in response to SSEL0. Thus, if an input address of 0000000000001 is provided as A11–A0, respectively, to address the group of row segments S3–S4 of row 122(0), A10A10–A1 will address row 122(0), A0 will address row segment S3, and SSEL0 can be used to select row segment S4.

In the 1k×288 mode, ten bits A9–A0 are used to uniquely address each of the 1k groups of row segments in CAM array 102. Each group of row segments includes four row segments (i.e., an entire row). The most significant bits A11–A10 do not participate in addressing a group of row segments. Bits A9–A0 are selected by RA select logic 203 as the row address and are used by row decoder 202 to select one of the CAM rows. In this mode, SZ288 is enabled and SA select logic 206 provides SSEL1 and SSEL0 as SDA1 and SDA0, respectively, to segment decoder 204. SSEL1 and SSEL0 are decoded by segment decoder 204 to generate SEN1–SEN4 and select a particular row segment in a selected row of cells for communication. Thus, if an input address of 0000000000001 is provided as A11–A0, respectively, to address the group of row segments S1–S4 of row 122(1), A9–A0 will address row 122(1), and SSEL1 and SSEL0 can be used to select each of row segments S1–S4.

Further information regarding various embodiments and operation of address logic 200, as well as RA select logic 203 and SA select logic 206, can be found in U.S. Pat. No. 6,243,281, which is referenced above and incorporated herein by reference.

Note that FIG. 3 disclosed a particular example of the operation of decoder 200 for a particular number of possible CAM array configurations. The method used in the example of FIG. 3 can be readily extended to accommodate any number of configurations of any size CAM array having any number of row segments each having any number of CAM cells. For example, a CAM array having more row segments can be accommodated by supplying more address bits (SA), select signals, and configuration signals to SA select logic 206 (and/or RA select logic 203), and increasing the number of SDA bits, the size of segment decoder 204 and the number of segment enable signals. In general, the row address will have $\log_2 Y$ bits to select one of the Y word lines, and the SA address, SSEL and SDA will each have up to $\log_2 Z$ bits to address one of the Z segment enable lines.

With reference again to FIG. 1, comparand data may be compared with the data stored in one or more of the row segments in array 102. The comparand data may be provided on comparand bus CBUS and stored in comparand register 108, or provided directly to array 102 for comparison.

For one embodiment, the width of the CBUS is the same as the total number of CAM cells in a row of CAM cells (i.e., ZW bits). When the device is configured in ZY×W mode, Z copies of the comparand data can be loaded into the comparand register for comparison with each of the Z segments in each row 122. Similarly, in the ZY/2×2W mode, Z/2 copies of the comparand data can be loaded into the comparand register. This methodology can be used until in the Y×ZW mode, when the comparand data is as wide (has as many bits) as an entire row 122.

Figure 6:
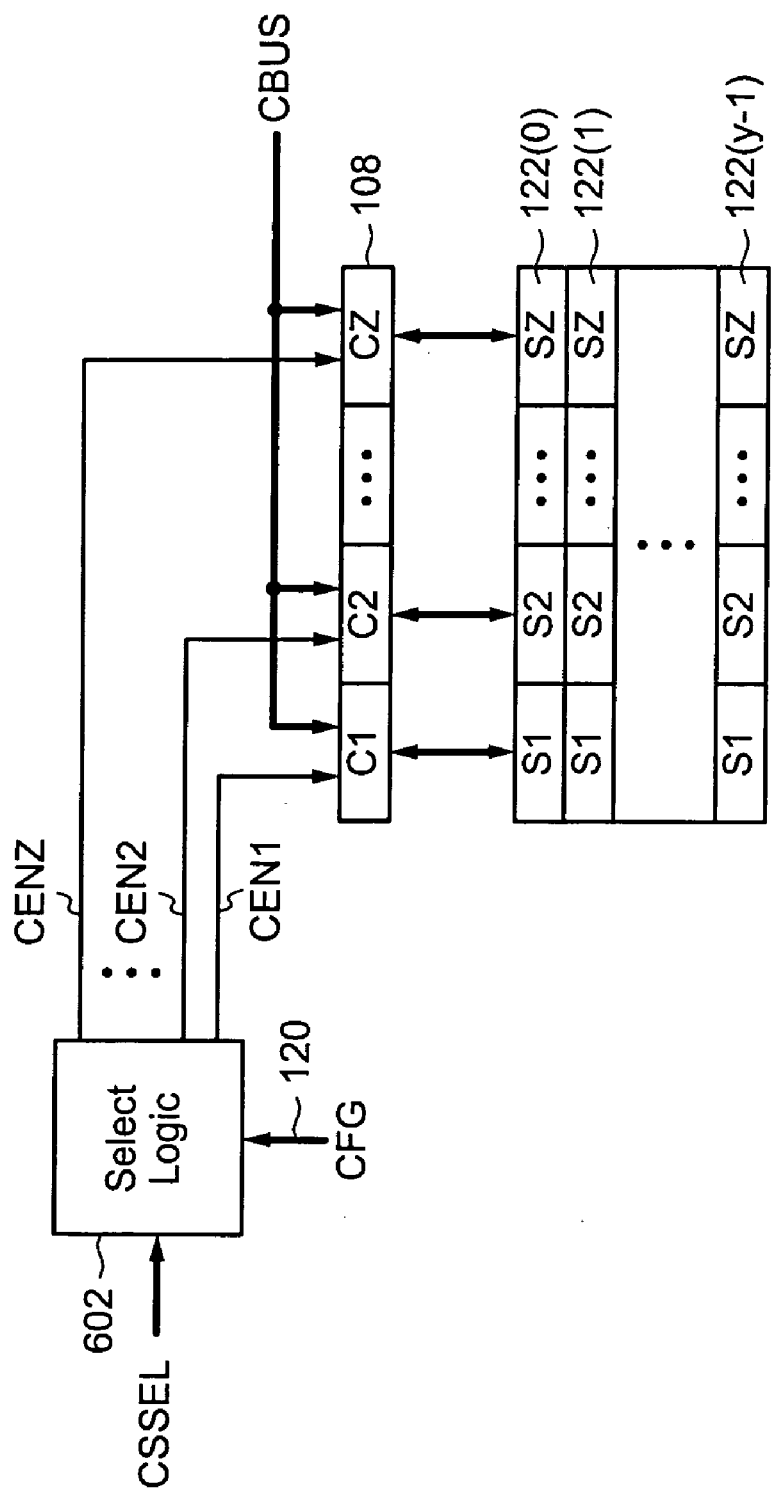
FIG. 6 is a block diagram of one embodiment of circuitry to load comparand data into the comparand register.

For other embodiments, the CBUS may have a smaller number of bits than the total number of bits for the rows 122. For one example, the width of the CBUS may be the same as the number of CAM cells in a row segment (i.e., W bits) and the comparand data sequentially and successively provided to each of the row segments S1–SZ for comparison. The comparand register may be segmented into Z segments each corresponding to one of the Z row segments in each of rows 122, as shown in FIG. 6. Comparand data can be separately loaded into each of the segments C1–CZ of the comparand register 108 by enable signals CEN1–CENZ, respectively. Select logic 602 generates the enable signals CEN in response to the comparand segment select signals CSSEL and the configuration information. The CSSEL signals may be generated by the instruction decoder 106 in response to a compare instruction, or may be separately generated by the user. When the device is configured in ZY×W mode, the CSSEL signals cause select logic 602 to enable all CEN signals such that the same comparand data is simultaneously written into all of C1–CZ. In the ZY/2×2W mode (i.e., two row segments per group), the CSSEL signals cause select logic 602 to enable the odd CEN signals CEN1, CEN3, etc. such that the same first portion of comparand data is written into the first comparand segments associated with the first row segments S1, S3, etc. In a subsequent cycle, the CSSEL signals cause select logic 602 to enable the even CEN signals CEN2, CEN4, etc. such that the same second portion of comparand data is written into the second comparand segments associated with the second row segments S2, S4, etc. The first and second portions of comparand data together form the entire (2W) comparand data. This methodology continues until in the Y×ZW mode, when the CEN signals are sequentially enabled to consecutively load each portion (W) of the ZW comparand data into one of the Z comparand segments. The operation of this embodiment is further illustrated by the example of FIG. 7.

Figure 7:
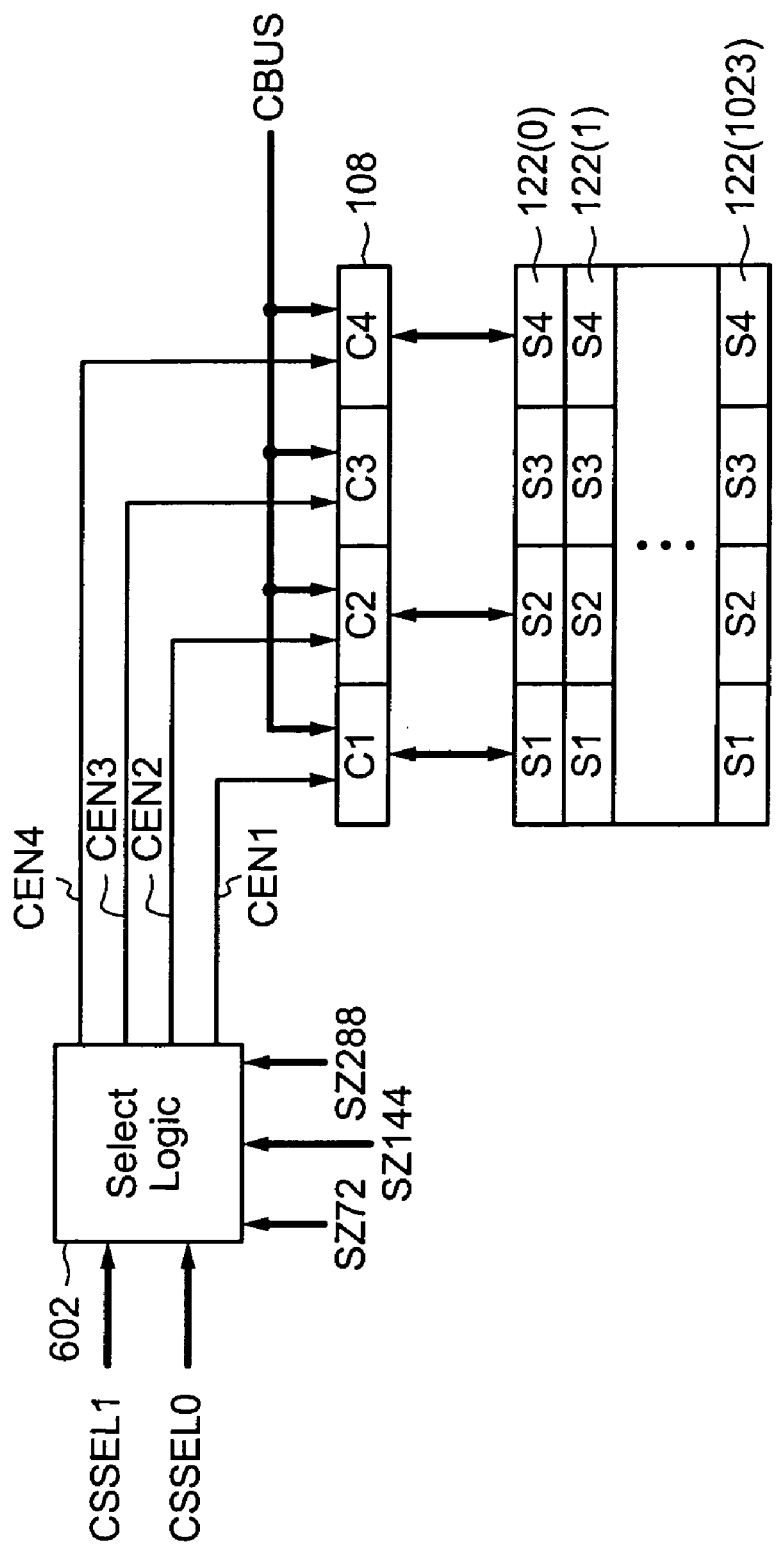
FIG. 7 is one example of the circuitry of FIG. 6 for particular configurations of the CAM device.

FIG. 7 shows an example in which the CAM array has Y=1024 rows 122(0)–122(1023), Z=4 row segments S1–S4 per row, and each row segment has W=72 CAM cells. The CBUS is also 72 bits wide and provides 72-bit comparand data to each of comparand segments C1–C4 under the control of enable signals CEN1–CEN4, respectively. Select logic 602 generates the enable signals in response to CSSEL1 and CSSEL0 and the configuration signals SZ72, SZ144 and SZ288. The truth table for the operation of select logic 602 for this embodiment is shown in FIG. 8. When SZ72 is enabled, the CAM array operates in a 4k×72 mode, and CEN1–CEN4 are all enabled to simultaneously load the same 72-bit comparand data from the CBUS. When SZ144 is enabled, the CAM array operates in a 2k×144 mode and CSSEL0 determines which CEN signals are enabled. First, C1 and C3 are enabled to receive a first portion of the comparand data when CSSEL1 is in a logic zero state. Subsequently, C2 and C4 are enabled to receive a second portion of the comparand data when CSSEL0 is in a logic one state. When SZ288 is enabled, the CAM array operates in a 1k×288 mode and both CSSEL1 and CSSEL0 determine when each of the CEN signals are enabled to receive comparand data. In this mode, select logic 602 operates as a 2-to-4 decoder.

Further information regarding various embodiments and operation of select logic 602 can be found in U.S. Pat. No. 6,243,281, which is referenced above and incorporated herein by reference.

With reference again to FIG. 1, the comparand data may be compared with the data stored in one or more of the row segments in array 102. Match results for comparison with each row segment are indicated on a corresponding match line segment. Each of the Z match line segments for a row of CAM cells are provided to match flag logic 114. The match flag logic generates a match flag signal MF indicative of when there is at least one match condition in array 102 with the comparand data. Match flag logic 114 is also responsive to the configuration information on bus 120 such that MF is appropriately enabled for the corresponding configuration of device 100. For example, when array 102 is in ZY×W mode, match flag logic 114 determines if the comparand data matches valid data stored in at least one row segment of array 102. When array 102 is configured in another mode utilizing groups of row segments (i.e., n greater than one for ZY/n×nW), match flag logic 114 determines if the comparand data matches valid data stored in at least one group of row segments of array 102.

Figure 9:
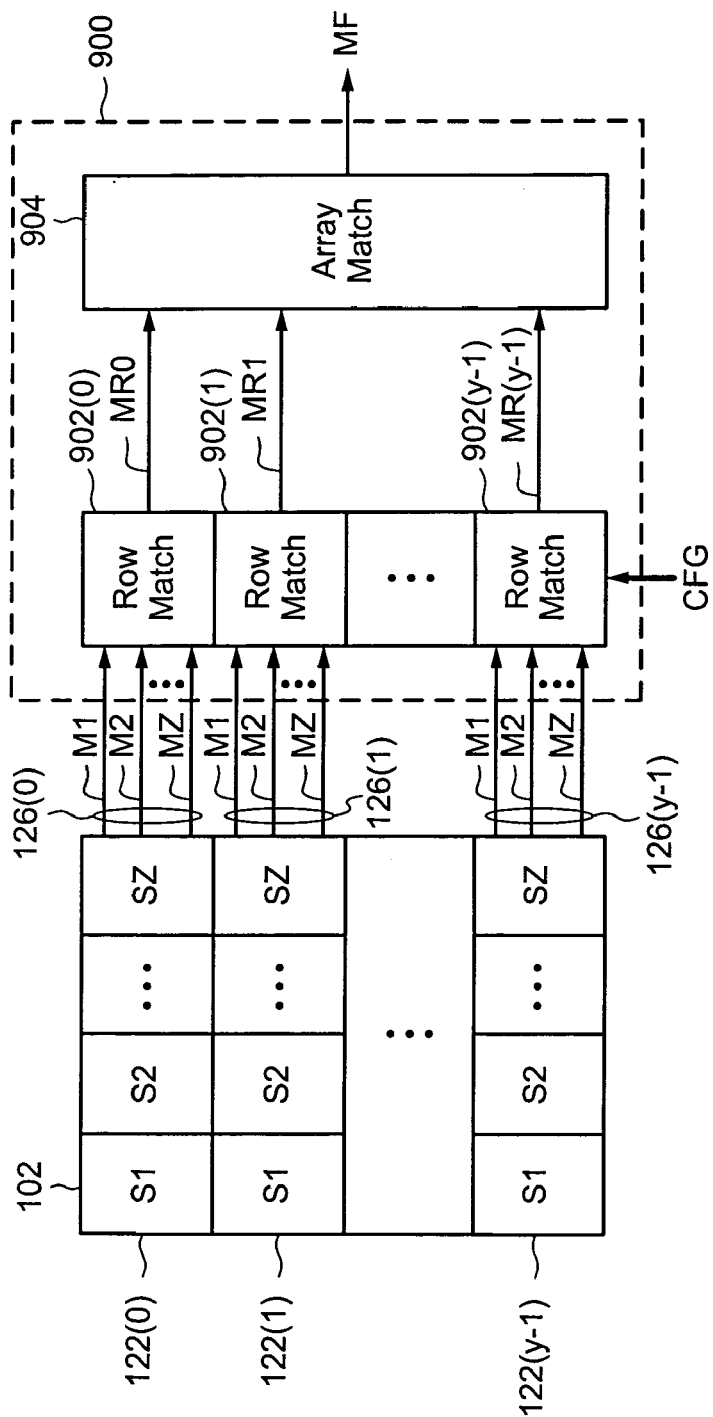
FIG. 9 is a block diagram of one embodiment of the match flag logic of FIG. 1.

FIG. 9 shows match flag logic 900 that is one embodiment of match flag logic 114 of FIG. 1. Match flag logic 900 includes row match circuits 902(0)–902(y-1) each associated with corresponding rows of CAM cells 122(0)–122(y-1), respectively. Each row match circuit 902 receives the match results from each of the match line segments M1–MZ of the corresponding row of CAM cells. In response to the match results on the match line segments and the configuration information, each row match circuit 902 generates a row match signal MR. Each row match signal is indicative of whether one or more row segments (i.e., for ZY×W mode), or one or more groups of row segments (i.e., for ZY/n×nW mode, where n is greater than 1), for a corresponding row stores data that matches the comparand data for a particular configuration. The row match signals MR0–MR(y-1) are then logically combined by array match circuit 904 to generate MF for the entire array 102. For one embodiment, array match circuit 904 includes OR logic that logically ORs the states of the row match signals MR0–MR(y-1).

Further information regarding various embodiments and operation of match flag logic 900 of FIG. 9, as well as priority encoder logic 112, multiple match flag logic 116, and configuration register 118 of FIG. 1, can be found in U.S. Pat. No. 6,243,281, which is referenced above and incorporated herein by reference.

Figure 10:
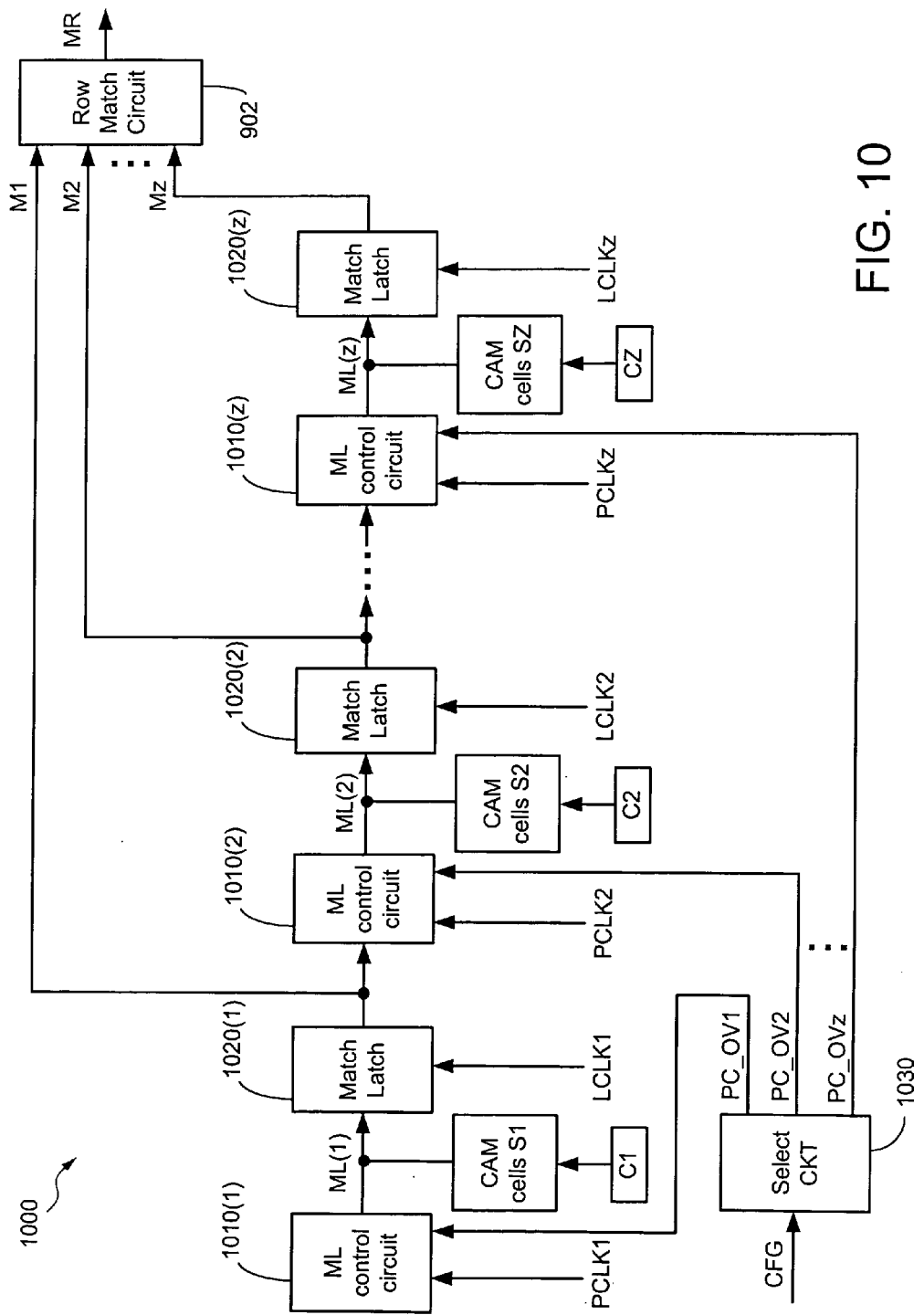
FIG. 10 is a block diagram of a row of CAM cells of the CAM array of FIG. 1 modified in accordance with one embodiment of the present invention.

FIG. 10 shows a row 1000 of CAM array 102 that is modified in accordance with one embodiment of the present invention to selectively pre-charge one or more match line segments in response to match results on one or more previous match line segments and in response to the configuration of the CAM array as indicated by the configuration information embodied by CFG. Row 1000 is shown to include Z row segments S1–SZ, each including any number of CAM cells coupled to a corresponding match line segment ML(1)–ML(Z) and coupled to a corresponding segment C1–CZ of the comparand register (see also FIG. 6), where Z can be any integer greater than one. Each match line segment ML is coupled to an output of a corresponding match line control circuit 1010 and to an input of a corresponding match latch 1020. The output M of each match latch 1020 is coupled to an input of the match line control circuit 1010 in the next row segment, and is also coupled to a corresponding input of the row match circuit 902 (see also FIG. 9). Each match latch 1020 latches the match results for the corresponding row segment during compare operations between comparand data and data stored in the row segment's CAM cells. For some embodiments, each match latch 1020 latches the match results on its ML input in response to a corresponding latch clock LCLK. For example, when LCLK1 is asserted (e.g., to logic high), match latch 1020(1) latches the match results on ML(1) generated by CAM cells in first row segment S1 during compare operations with comparand data from comparand register segment C1. The match latch clock signals LCLK1–LCLKz may be generated by any suitable timing generator, state machine, or other suitable circuit in response to the configuration information CFG. For simplicity, select logic 602, read/write circuitry 110, word lines WL, and other well-known components of the CAM device described above are not shown in FIG. 10.

Each match latch 1020 may be any suitable circuit that latches the logic state of its input match line segment ML in response to the assertion of LCLK. For some embodiments, each match latch 1020 includes AND logic that drives its output M to logic high in response to its input ML being logic high and the corresponding LCLK signal being asserted to logic high and, conversely, drives its output M to logic low in response to either its input ML being logic low or its corresponding LCLK signal being de-asserted to logic low. Each match latch 1020 may include one or more other logic gates. For other embodiments, each match latch 1020 may be a voltage level shifter (e.g., a logic gate) that adjusts the voltage level on M to appropriate logic levels for match line control circuit 1010 and row match circuit 902. For yet other embodiments, match latches 1020(1)–1020(z) may be omitted and each match line segment ML may be coupled to the input of the match line control circuit 1010 for the next row segment and to the corresponding input of row match circuit 902.

Each match line control circuit 1010 includes control inputs to receive a corresponding pre-charge clock signal PCLK and a corresponding pre-charge override signal PC_OV, a data input coupled to the match line segment in the previous row segment, and an output coupled to the match line segment in the row segment corresponding to the match line control circuit. The pre-charge clock signals PCLK1–PCLKz may be generated by any suitable timing generator, state machine, or other suitable circuit in response the configuration information CFG, and the pre-charge override signals PC_OV1–PC_OVz are generated by a select circuit 1030 in response to CFG. Although not shown for simplicity, for some embodiments, the match line control circuit 1010(1) for the first row segment S1 includes a match input tied to VDD. During compare operations, each match line control circuit 1010 selectively pre-charges (e.g., to VDD) its match line segment ML in response to corresponding PCLK and PC_OV signals and the match results indicated on the previous match line segment. For some embodiments, for each PC_OV signal that is de-asserted (e.g., to logic low), the corresponding match line control circuit 1010 pre-charges its match line segment ML upon assertion of the corresponding PCLK signal if there is a match condition in the previous row segment and does not pre-charge its match line segment if there is a mismatch condition in the previous row segment. Conversely, for each PC_OV signal that is asserted (e.g., to logic high), the corresponding match line control circuit 1010 pre-charges its match line segment upon assertion of the corresponding PCLK signal, irrespective of the match conditions in the previous row segment.

For example, if select circuit 1030 asserts PC_OV2, match line control circuit 1010(2) pre-charges ML(2) upon assertion of PCLK2, regardless of match conditions in row segment S1. Conversely, if select circuit 1030 de-asserts PC_OV2, match line control circuit 1010(2) pre-charges ML(2) upon assertion of PCLK2 if there is a match condition in row segment S1 and does not pre-charge ML(2) if there is a mismatch condition in row segment S1. In this manner, when PC_OV is de-asserted, mismatch conditions in one or more previous row segments may prevent the pre-charging of match line segments in one or more subsequent row segments, which may reduce power consumption of the CAM device during compare operations. The power savings realized by present embodiments are proportional to the number of row segments in the CAM array, the number of row segments that are uniquely addressed (e.g., the width and depth configuration of the CAM array), and the percentage of mismatch conditions in the first row segment of each uniquely addressed group. When employed in applications where compare operations typically result in mismatch conditions, and in particular where only the match line in the first row segment in each uniquely addressed group of row segments is pre-charged, present embodiments may achieve significant power savings.

Exemplary compare operations in which each row 1000 of the CAM array has Z=4 row segments S1–S4 are described below with respect to row 1100 of FIG. 11 and the timing diagrams of FIGS. 12A–12C. For the examples described below, each of row segments S1–SZ has W=72 CAM cells, the CBUS is 72 bits wide and provides 72-bit comparand data to each of comparand segments C1–C4 under the control of enable signals CEN1–CEN4, respectively, and select logic 602 generates the enable signals CEN in response to CSSEL1 and CSSEL0 and the configuration signals SZ72, SZ144 and SZ288 as described above with respect to FIGS. 6–8. However, for other embodiments, each of row segments S1–SZ may include other suitable numbers of CAM cells, and the CBUS and comparand register segments C1-CZ may be of any suitable width. For simplicity, the CBUS, select logic 602, and CEN signals are not shown in FIG. 11, and the configuration signals SZ72, SZ144, and SZ288 are represented collectively as CFG in FIG. 11.

When SZ72 is enabled, the CAM array operates in a 4k×72 mode, and CEN1–CEN4 are all enabled to simultaneously load the same 72-bit comparand data (CMP) from the CBUS into the four comparand register segments C1–C4. In this configuration mode, where each row segment S1–S4 of row 1100 can be uniquely addressed, select circuit 1030 asserts PC_OV1–PC_OV4 in response to SZ72 being enabled. The asserted states of PC_OV1–PC_OV4 cause corresponding match line control circuits 1010(1)–1010(4) to pre-charge their corresponding match line segments ML(1)–ML(4) upon assertion of PCLK1–PCLK4, respectively, without regard to match conditions in other row segments. Thus, because each row segment S1–S4 in row 1100 operates independently for this configuration, match results in previous row segments are not relevant to pre-charging the match line segments in subsequent row segments.

Figure 12A:
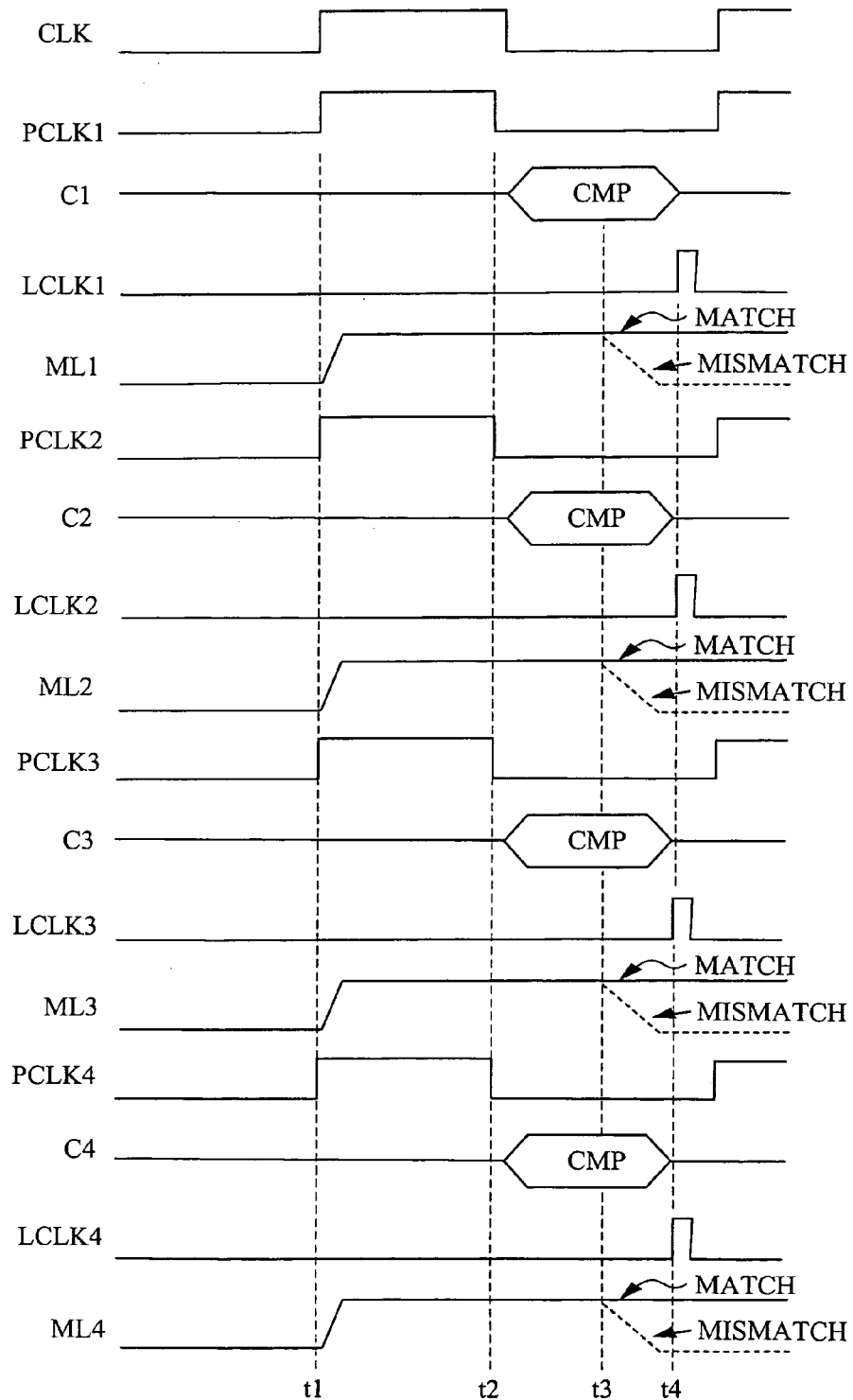
FIGS. 12A–12C are exemplary timing diagrams illustrating compare operation for various width and depth configurations for the row of FIG. 11.

Referring also to the exemplary timing diagram of FIG. 12A, at time t1, CLK transitions to logic high, which causes PCLK1–PCLK4 to be asserted to logic high. The assertion of PC_OV1–PC_OV4 in response to SZ72 being enabled causes respective match line control circuits 1010(1)–1010(4) to pre-charge corresponding match line segments ML(1)–ML(4) to logic high (e.g., toward VDD) upon assertion of PCLK1–PCLK4, irrespective of match results in other row segments. At time t2, PCLK1–PCLK4 are de-asserted to logic low. Shortly thereafter, CLK transitions to logic low, and the 72-bit comparand data CMP in C1–C4 are simultaneously compared with data stored in the CAM cells of corresponding row segments S1–S4 to generate match results on ML(1)–ML(4), respectively, at time t3. For each row segment S1–S4, if there is a match, the corresponding match line segment ML(1)–ML(4) remains in its pre-charged high logic state, and if there is a mismatch, the corresponding match line segment ML(1)–ML(4) is discharged to a low logic state (e.g., toward ground potential). At time t4, LCLK1–LCLK4 are asserted to enable corresponding match latches 1020(1)–1020(4) to latch (e.g., to detect) the match results on ML(1)–ML(4), respectively. Thereafter, the match latches 1020(1)–1020(4) provide the match results via corresponding signal lines M1–M4 to row match circuit 902, which in response thereto selectively asserts a match signal on MR as described above with respect to FIG. 9.

When SZ144 is enabled, the CAM array operates in a 2k×144 mode, and the CSSEL signals determines which CEN signals are enabled so that the first 72-bit portion (CMPa) of the comparand word is first loaded into comparand register segments C1 and C3 and the second 72-bit portion (CMPb) of the comparand word is then loaded into comparand register segments C2 and C4, as described above. In this configuration mode, where a first group of row segments S1–S2 and a second group of row segments S3–S4 of row 1100 can be uniquely addressed, select circuit 1030 asserts PC_OV1 and PC_OV3 and de-asserts PC_OV2 and PC_OV4 in response to SZ144 being enabled. The asserted state of PC_OV1 and PC_OV3 causes corresponding match line control circuits 1010(1) and 1010(3) to pre-charge their corresponding match line segments ML(1) and ML(3) upon assertion of PCLK1 and PCLK3, respectively, without regard to match conditions in other row segments. The de-asserted state of PC_OV2 and causes match line control circuit 1010(2) to pre-charge match line segment ML(2) upon assertion of PCLK2 only if there is a match condition in row segment S1, and the de-asserted state of PC_OV4 and causes match line control circuit 1010(4) to pre-charge match line segment ML(4) upon assertion of PCLK4 only if there is a match condition in row segment S3.

Figure 12B:
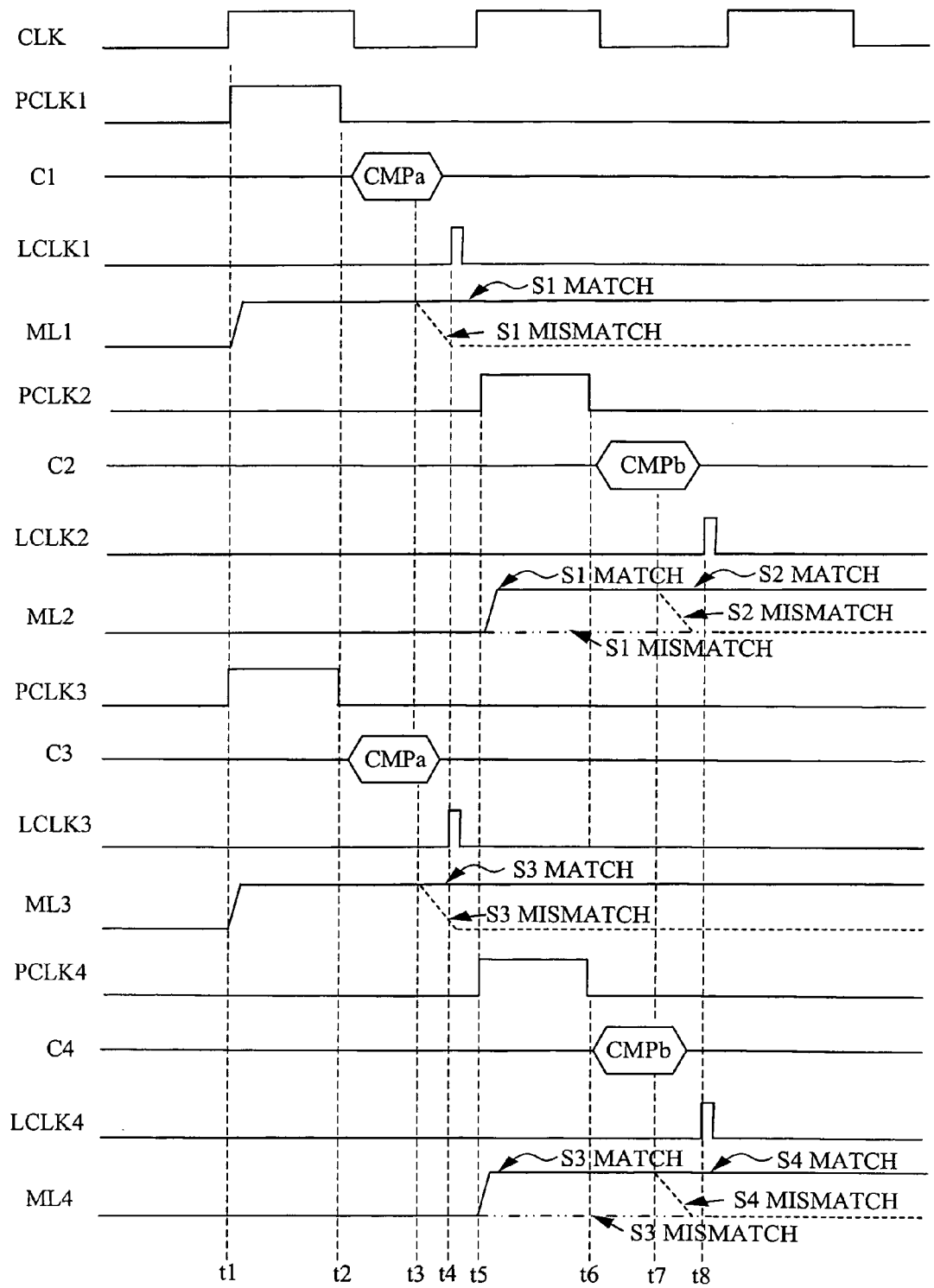

Referring also to the exemplary timing diagram of FIG. 12B, at time t1, CLK transitions to logic high, which causes PCLK1 and PCLK3 to be asserted to logic high. Because PC_OV1 and PC_OV3 are asserted, the assertion of PCLK1 and PCLK3 causes respective match line control circuits 1010(1) and 1010(3) to pre-charge corresponding match line segments ML(1) and ML(3) to logic high, irrespective of match results in other row segments. At time t2, PCLK1 and PCLK3 are de-asserted to logic low. Shortly thereafter, CLK transitions to logic low, and CMPa in C1 and C3 are simultaneously compared with data stored in the CAM cells of corresponding row segments S1 and S3 to generate match results on ML(1) and ML(3), respectively, at time t3. For each row segment S1 and S3, if there is a match, the corresponding match line segment remains in its pre-charged high logic state and, conversely, if there is a mismatch, the corresponding match line segment is discharged to a low logic state. At time t4, LCLK1 and LCLK3 are asserted to enable corresponding match latches 1020(1) and 1020(3) to latch the match results on ML(1) and ML(3), respectively. Thereafter, the match latches 1020(1) and 1020(3) provide the match results to row match circuit 902 and to the inputs of respective match line control circuits 1010(2) and 1010(4) via corresponding signal lines M1 and M3.

If there is a match condition in first row segment S1, the resulting logic high state of M1 causes match line control circuit 1010(2) to pre-charge ML(2) upon assertion of PCLK2 at time t5. Similarly, if there is a match condition in third row segment S3, the resulting logic high state of M3 causes match line control circuit 1010(4) to pre-charge ML(4) upon assertion of PCLK4 at time t5. At time t6, PCLK2 and PCLK4 are de-asserted to logic low. Shortly thereafter, CLK transitions to logic low, and CMPb in C2 and C4 are simultaneously compared with data stored in the CAM cells of corresponding row segments S2 and S4 to generate match results on ML(2) and ML(4), respectively, at time t7. For each row segment S2 and S4, if there is a match, the corresponding match line segment remains in its pre-charged high logic state and, conversely, if there is a mismatch, the corresponding match line segment is discharged to a low logic state. At time t8, LCLK2 and LCLK4 are asserted to enable corresponding match latches 1020(2) and 1020(4) to latch the match results on ML(2) and ML(4), respectively. Thereafter, the match latches 1020(2) and 1020(4) provide the match results to match logic 902 via corresponding signal lines M2 and M4.

If there is not a match condition in the first row segment S1, the resulting logic low state of M1 causes match line control circuit 1010(2) to not pre-charge ML(2) upon assertion of PCLK2. Similarly, if there is not a match condition in the third row segment S3, the resulting logic low state of M3 causes match line control circuit 1010(4) to not pre-charge ML(4) upon assertion of PCLK4. Thus, in accordance with the present invention, mismatch conditions in row segments S1 and S3 may force mismatch conditions for subsequent row segments S2 and S4, respectively, without pre-charging their match line segments, thereby saving power consumption associated with pre-charging match line segments ML(2) and/or ML(4).

When SZ288 is enabled, the CAM array operates in a 1k×288 mode and the CSSEL signals determine when each of the CEN signals are enabled to receive comparand data so that successive portions (CMPa–CMPd) of the comparand word are sequentially loaded into corresponding comparand register segments C1–C4, as described above. In this configuration mode, where all row segments S1–S4 in row 1100 operate as a single uniquely addressed group, select circuit 1030 asserts PC_OV1 and de-asserts PC_OV2–PC_OV4 in response to SZ288 being enabled. The asserted state of PC_OV1 causes match line control circuit 1010(1) to pre-charge match line segment ML(1) upon assertion of PCLK1. The de-asserted states of PC_OV2-PC_OV4 cause respective match line control circuits 1010(2)–1010(4) to selectively pre-charge their corresponding match line segments upon assertion of PCLK2–PCLK4, respectively, only if there are match conditions in previous row segments.

Figure 12C:
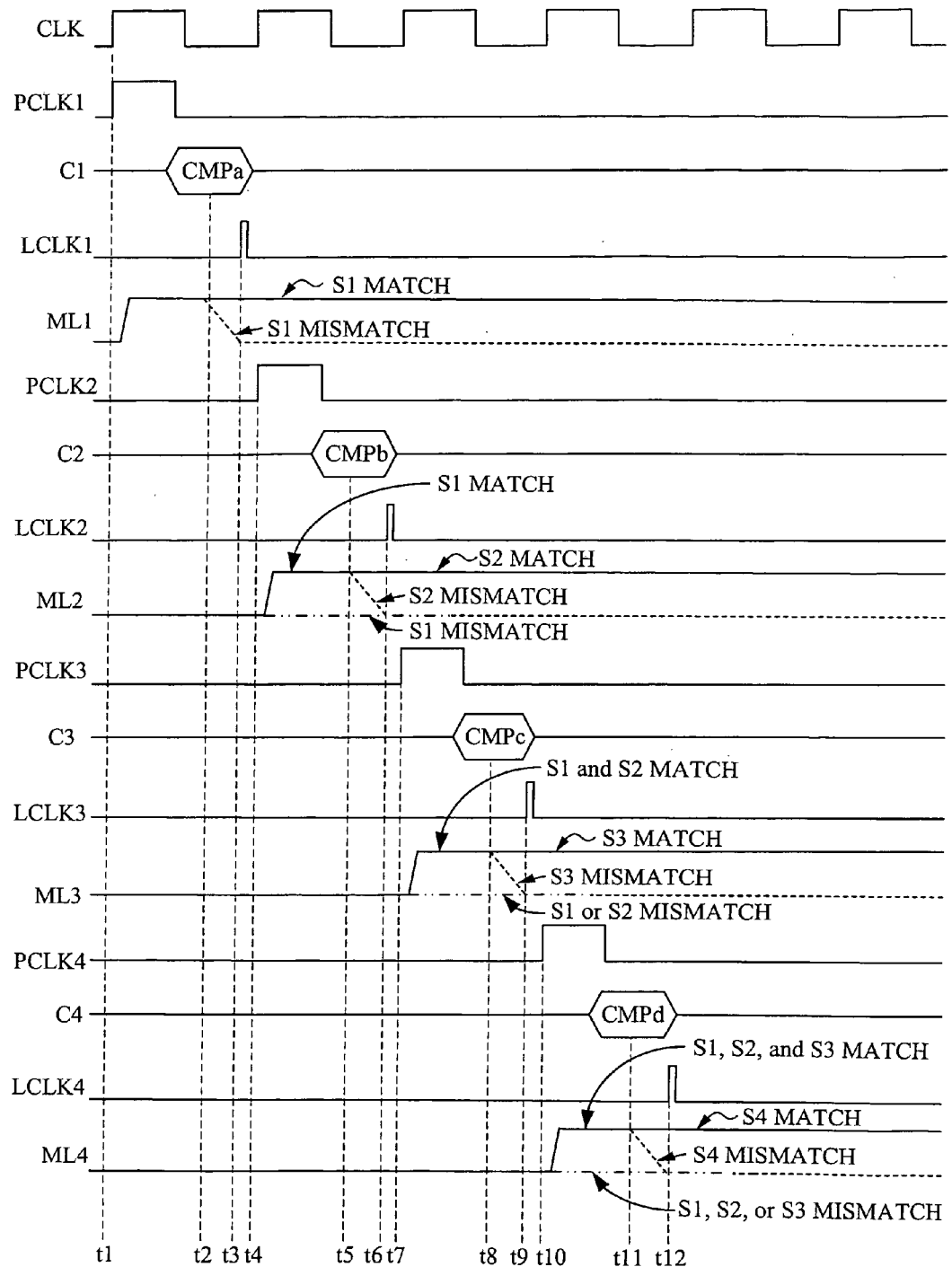

Referring also to the exemplary timing diagram of FIG. 12C, at time t1, CLK transitions to logic high, which causes PCLK1 to be asserted to logic high. Because PC_OV1 is asserted, the assertion of PCLK1 causes match line control circuit 1010(1) to pre-charge match line segment ML(1) to logic high. After PCLK1 is de-asserted to logic low, CLK transitions to logic low, and CMPa in C1 is compared with data stored in the CAM cells of row segment S1 to generate match results on ML(1) at time t2. If there is a match in first row segment S1, ML(1) remains in its pre-charged high logic state and, conversely, if there is a mismatch, ML(1) is discharged to a low logic state. At time t3, LCLK1 is asserted to enable match latch 1020(1) to latch the match results on ML(1).

If there is a match condition in first row segment S1, the resulting logic high state of M1 causes match line control circuit 1010(2) to pre-charge ML(2) upon assertion of PCLK2 at time t4. After PCLK2 is de-asserted to logic low, CLK transitions to logic low, and CMPb in C2 is compared with data stored in the CAM cells of row segment S2 to generate match results on ML(2) at time t5. If there is a match in second row segment S2, ML(2) remains in its pre-charged high logic state and, conversely, if there is a mismatch, ML(2) is discharged to a low logic state. At time t6, LCLK2 is asserted to enable match latch 1020(2) to latch the match results on ML(2).

If there is a match condition in second row segment S2, the resulting logic high state of M2 causes match line control circuit 1010(3) to pre-charge ML(3) upon assertion of PCLK3 at time t7. After PCLK3 is de-asserted to logic low, CLK transitions to logic low, and CMPc in C3 is compared with data stored in the CAM cells of row segment S3 to generate match results on ML3 at time t8. If there is a match in third row segment S3, ML3 remains in its pre-charged high logic state and, conversely, if there is a mismatch, ML3 is discharged to a low logic state. At time t9, LCLK3 is asserted to enable match latch 1020(3) to latch the match results on ML(3).

If there is a match condition in third row segment S3, the resulting logic high state of M3 causes match line control circuit 1010(4) to pre-charge ML(4) upon assertion of PCLK4 at time t10. After PCLK4 is de-asserted to logic low, CLK transitions to logic low, and CMPd in C4 is compared with data stored in the CAM cells of row segment S4 to generate match results on ML(4) at time t11. If there is a match in fourth row segment S4, ML(4) remains in its pre-charged high logic state and, conversely, if there is a mismatch, ML(4) is discharged to a low logic state. At time t12, LCLK4 is asserted to enable match latch 1020(4) to latch the match results on ML(4).

If there is a mismatch condition in any of row segments S1–S4, none of the match line segments in the corresponding subsequent row segments are pre-charged, thereby reducing power consumption during compare operations associated with match line pre-charging. For example, if there is a mismatch condition in first row segment S1, the resulting logic low state of ML(1) causes match line control circuit 1010(2) to not pre-charge ML(2) at time t4, which in turn causes match line control circuits 1010(3) and 1010(4) to not pre-charge ML(3) and ML(4), respectively. If there is a mismatch condition in second row segment S2, the resulting logic low state of ML(2) causes match line control circuit 1010(3) to not pre-charge ML(3) at time t7, which in turn causes match line control circuit 1010(4) to not pre-charge ML(4). If there is a mismatch condition in third row segment S3, the resulting logic low state of ML(3) causes match line control circuit 1010(4) to not pre-charge ML(4) at time t10. Thus, for this configuration, mismatch conditions in any row segment forces mismatch conditions in all subsequent row segments without pre-charging their corresponding match line segments, which reduces power consumption during compare operations.

Figure 11:
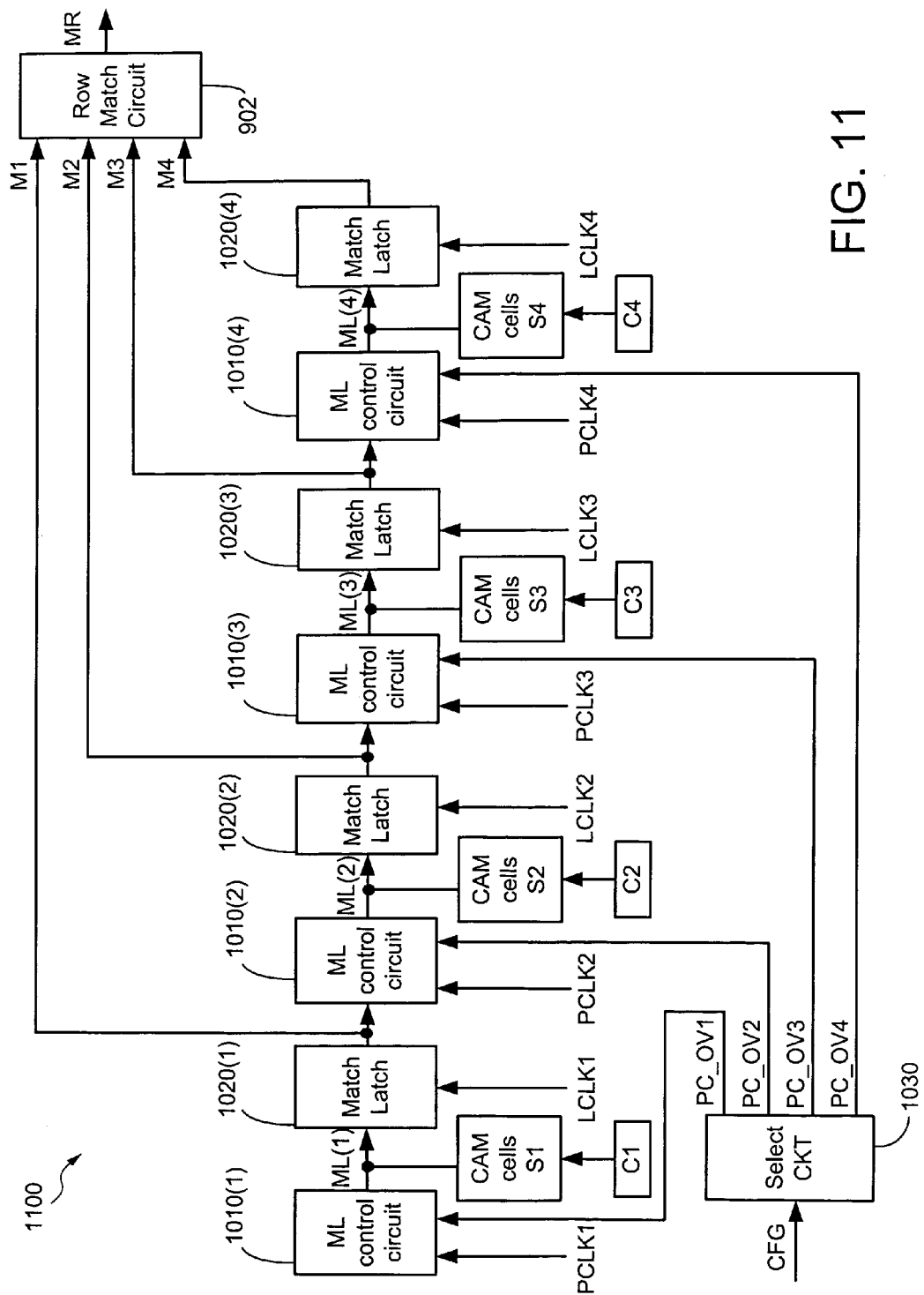
FIG. 11 is one example of the row of FIG. 10 for particular configurations of the CAM array.

Many different logic circuits can be used to implement the logic function performed by match line control circuits 1010 of FIGS. 10 and 11. The logic function performed by match line control circuits 1010 is summarized below in the truth table of Table 1, where "x" represents a don't care logic state.

TABLE 1

| PCLK | PC_OV | ML (x-1) | ML (x) |
|------|-------|----------|--------|
| 0    | 0     | x        | 0      |
| 0    | 1     | x        | 0      |
| 1    | 0     | 0        | 0      |
| 1    | 0     | 1        | 1      |
| 1    | 1     | x        | 1      |

For some embodiments, match line control circuits 1010 include a dynamic pre-charge circuit coupled between the corresponding match line segment and VDD, and include a dynamic discharge circuit coupled between the corresponding match line segment and ground potential. For such embodiments, the dynamic pre-charge circuit pre-charges the corresponding match line segment upon assertion of PCLK when either (1) PC_OV is asserted or (2) when PC_OV is de-asserted and there is a match condition in the previous row segment, and the dynamic discharge circuit discharges the corresponding match line segment upon assertion of PCLK when PC_OV is de-asserted and there is a mismatch condition in the previous row segment.

Figure 13:
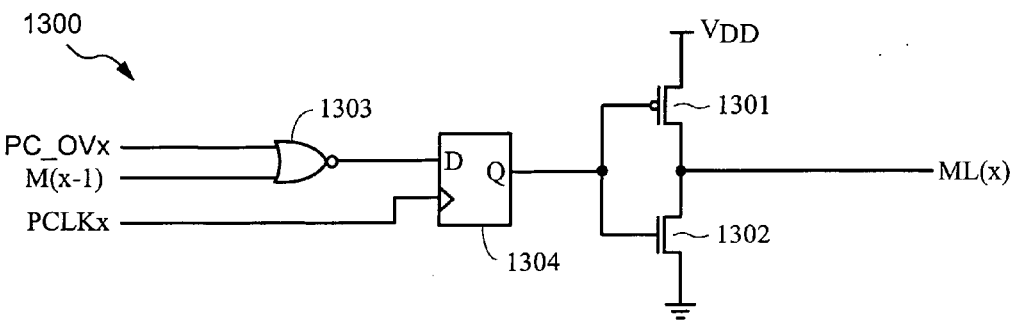
FIG. 13 is a circuit diagram of one embodiment of the match line control circuit of FIGS. 10 and 11.

For example, FIG. 13 shows a match line control circuit 1300 that is one embodiment of match line control circuits 1010 of FIGS. 10 and 11. Match line control circuit 1300 includes an inverter formed by a series connection of a PMOS transistor 1301 and an NMOS transistor 1302 between VDD and ground potential, a NOR gate 1303, and a D-type flip-flop 1304. For other embodiments, flip-flop 1304 may be any suitable latch responsive to PCLK. NOR gate 1303 has a first input to receive PC_OVx, a second input coupled to M(x-1), and an output coupled to the data input of flip-flop 1304. Flip-flop 1304 has a clock input to receive PCLKx, and has an output coupled to the input of the inverter, which in turn has an output coupled to ML(x).

When PC_OVx is asserted to logic high, the output of NOR gate 1303 is forced to a logic low state, which is output by flip-flop 1304 when PCLKx is asserted to logic high to turn on PMOS transistor 1301 and turn off transistor 1302, thereby charging ML(x) toward VDD. When PC_OVx is de-asserted to logic low, the complement of the logic state of M(x-1) is output by flip-flop 1304 upon assertion of PCLKx. Thus, if M(x-1) is in a logic high state (e.g., indicating a match condition in the previous row segment), flip-flop 1304 outputs a logic low signal upon assertion of PCLKx, which as described above pre-charges ML(x). Conversely, if M(x-1) is in a logic low state (e.g., indicating a mismatch condition in the previous row segment), flip-flop 1304 outputs a logic high signal upon assertion of PCLKx. This logic high signal turns off PMOS transistor 1301 and turn on NMOS transistor 1302, thereby discharging ML(x) to a logic low state (e.g., toward ground potential). For another embodiment, NMOS pull-down transistor 1302 can be omitted.

For other embodiments, match line control circuits 1010 may also include a static pull-up circuit that provides a relatively weak pre-charge current for the corresponding match line segment to maintain the match line segment in its logic high state during match conditions in the corresponding row segment.

Figure 14:
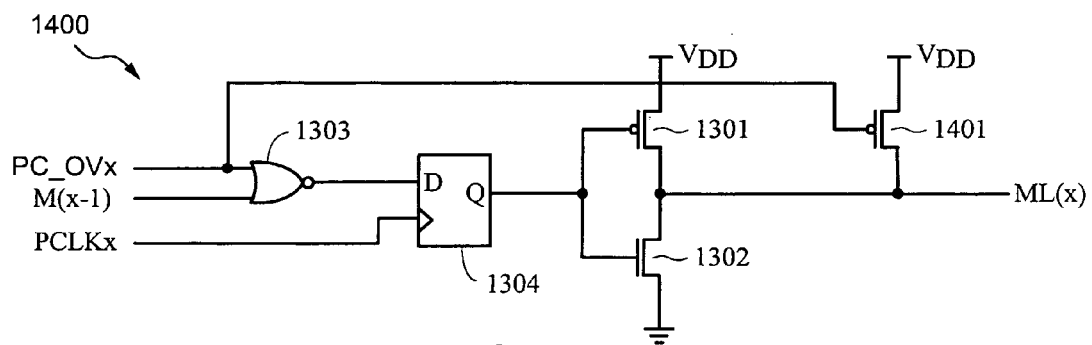
FIG. 14 is a circuit diagram of another embodiment of the match line control circuit of FIGS. 10 and 11.

For one example, FIG. 14 shows a match line control circuit 1400 that is another embodiment of match line control circuits 1010 of FIGS. 10 and 11. In addition to the elements of match line control circuit 1300, match line control circuit 1400 includes a weak PMOS pull-up transistor 1401 coupled between VDD and ML(x) and having a gate to receive PC_OVx. Operation of match line control circuit 1400 is similar to that of match line control circuit 1300, except that assertion of PC_OVx turns on weak PMOS transistor 1401 to provide a relatively weak pre-charge current for ML (x).

Figure 15:
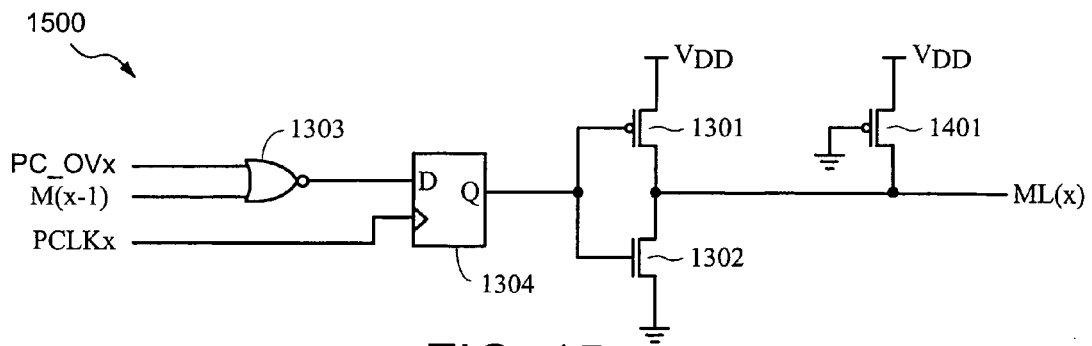
FIG. 15 is a circuit diagram of another embodiment of the match line control circuit of FIGS. 10 and 11.

For another example, FIG. 15 shows a match line control circuit 1500 that is another embodiment of match line control circuits 1010 of FIGS. 10 and 11. Match line control circuit 1500 is similar to match line control circuit 1400 of FIG. 14, except that the gate of weak PMOS pull-up transistor 1401 is coupled to ground potential to maintain PMOS pull-up transistor 1401 in a conductive state.

For other embodiments of match line control circuits 1300, 1400, and 1500, ML(x-1) may be coupled directly to the data input of flip-flop 1304, and NOR gate 1303 may be configured to have a first input coupled to the Q output of flip-flop 1304, a second input to receive PC_Ovx, and an output coupled to the input of the inverter formed by transistors 1301–1302.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A content addressable memory (CAM) device, comprising:
    a CAM array having a plurality of rows of CAM cells, each row segmented into a plurality of row segments, each row segment including:
        a plurality of CAM cells coupled to a corresponding match line segment; and
        a match line control circuit having a data input coupled to the match line segment in a previous row segment, an output coupled to the corresponding match line segment, and a first control input to receive a corresponding pre-charge override signal; and
    a select circuit having an input to receive configuration information indicative of a selected width and depth configuration of the CAM array and having outputs to generate the pre-charge override signals.

2. The CAM device of claim 1, wherein each match line control circuit is configured to selectively pre-charge its corresponding match line segment in response to match results in the previous row segment if the corresponding pre-charge override signal is de-asserted.

3. The CAM device of claim 1, wherein each match line control circuit is configured to pre-charge its corresponding match line segment regardless of match results in previous row segments if the corresponding pre-charge override signal is asserted.

4. The CAM device of claim 1, wherein the select circuit asserts the pre-charge override signal for the first row segment and de-asserts the pre-charge override signals for all subsequent row segments in response to the configuration information being in a state that allows each of the row segments in each row of the CAM array to be uniquely addressed.

5. The CAM device of claim 1, wherein the select circuit asserts every other pre-charge override signal in response to the configuration information being in a state that allows groups of two row segments in each row of the CAM array to be uniquely addressed.

6. The CAM device of claim 1, wherein the select circuit asserts the pre-charge override signal for a first row segment in each of a number of groups of row segments and de-asserts the pre-charge override signals for all subsequent row segments in each group in response to the configuration information being in a state that allows groups of any number of row segments of the CAM array to be uniquely addressed.

7. The CAM device of claim 6, wherein corresponding row segments in each group of row segments simultaneously perform a compare operation between a corresponding portion of a comparand word and data stored in the corresponding row segments.

8. The CAM device of claim 1, wherein each match line control circuit comprises:
    a dynamic pre-charge circuit coupled between the corresponding match line segment and a supply voltage; and
    a dynamic discharge circuit coupled between the corresponding match line segment and ground potential.

9. The CAM device of claim 8, wherein each match line control circuit further comprises:
    a static pre-charge circuit coupled between the corresponding match line segment and the supply voltage.

10. The CAM device of claim 1, wherein each match line control circuit includes a second control input to receive a corresponding pre-charge clock signal.

11. The CAM device of claim 10, wherein each match line control circuit comprises:
    a logic gate having a first input to receive the corresponding pre-charge override signal, a second input to receive match results from the previous row segment, and an output; and
    a latch having a data input coupled to the output of the logic gate, a clock input to receive the corresponding pre-charge clock signal, and an output to selectively pre-charge the corresponding match line segment.

12. The CAM device of claim 11, wherein each match line control circuit further comprises:
    a relatively weak pull-up transistor coupled between the corresponding match line segment and the voltage supply.

13. The CAM device of claim 1, further comprising:
    address logic coupled to the CAM array to uniquely address one of the row segments in response to the configuration information being in a first state, and to uniquely address a group of the row segments in response to the configuration information being in a second state, wherein the first configuration information is indicative of a first width and depth configuration of the CAM array, and the second configuration information is indicative of a second width and depth configuration of the CAM array.

14. The CAM device of claim 1, wherein each row segment further comprises:
    a match latch having an input coupled to the corresponding match line segment and an output coupled to the match line segment in a next row segment.

15. A content addressable memory (CAM) device, comprising:
    a CAM array having a plurality of rows of CAM cells, each row segmented into a plurality of row segments, each row segment comprising:
    a plurality of CAM cells coupled to a corresponding match line segment; and
    means for selectively pre-charging the match line segment in response to match results in a previous row segment and in response to configuration information indicative of a width and depth configuration of the CAM array.

16. The CAM device of claim 15, wherein each of the row segments in a selected row can be uniquely addressed when the configuration information is in a first state, and groups of row segments in the selected row can be uniquely addressed when the configuration information is in a second state.

17. The CAM device of claim 15, wherein the means for selectively pre-charging receives a corresponding pre-charge override signal that is selectively asserted in response to the configuration information.

18. The CAM device of claim 17, wherein the means for selectively pre-charging pre-charges the corresponding match line segment regardless of match conditions in the previous row segment if the pre-charge override signal is asserted.

19. The CAM device of claim 17, wherein the means for selectively pre-charging selectively pre-charges the corresponding match line segment in response to match conditions in the previous row segment if the pre-charge override signal is de-asserted.

20. The CAM device of claim 17, wherein the means for selectively pre-charging comprises:
a match line control circuit having a data input coupled to the match line segment in the previous row segment, an output coupled to the corresponding match line segment, and a control input to receive the corresponding pre-charge override signal.

21. The CAM device of claim 20, wherein the means for selectively pre-charging further comprises:
a select circuit having an input to receive the configuration information and having outputs to generate the pre-charge override signals.

22. A method of operating a content addressable memory (CAM) device having a CAM array including a plurality of rows each segmented into a plurality of row segments, each row segment having any number of CAM cells coupled to a corresponding match line segment, comprising:
providing configuration information to the CAM array, the configuration information indicative of a selected width and depth configuration for the CAM array; and
selectively pre-charging each match line segment in response to match results in a previous row segment and in response to the configuration information.

23. The method of claim 22, wherein the selectively pre-charging comprises:
selectively asserting a corresponding pre-charge override signal in response to the configuration information;
pre-charging the match line segment in response to match conditions in the previous row segment if the pre-charge override signal is de-asserted; and
pre-charging the match line segment regardless of match conditions in the previous row segment if the pre-charge override signal is asserted.

24. The method of claim 23, further comprising:
setting the configuration information to a state that allows each row segment to be uniquely addressed; and
asserting all the pre-charge override signals.

25. The method of claim 23, further comprising:
setting the configuration information to a state that allows groups of any number of row segments to be uniquely addressed;
asserting the pre-charge override signal for the first row segment in each group; and
de-asserting the pre-charge override signals for all subsequent row segments in each group.

* * * * *